United States Patent
Chuang et al.

(10) Patent No.: US 10,930,698 B2
(45) Date of Patent: Feb. 23, 2021

(54) PIXEL STRUCTURE TO IMPROVE BSI GLOBAL SHUTTER EFFICIENCY

(71) Applicant: PixArt Imaging Inc., Hsin-Chu County (TW)

(72) Inventors: Kai-Chieh Chuang, Hsin-Chu County (TW); Yung-Chung Lee, Hsin-Chu County (TW); Yen-Min Chang, Hsin-Chu County (TW)

(73) Assignee: PIXART IMAGING INC., Hsin-Chu County (TW)

( * ) Notice: Subject to any disclaimer, the term of this patent is extended or adjusted under 35 U.S.C. 154(b) by 0 days.

(21) Appl. No.: 16/383,663

(22) Filed: Apr. 15, 2019

(65) Prior Publication Data
US 2019/0363115 A1   Nov. 28, 2019

(30) Foreign Application Priority Data
May 25, 2018 (TW) .................................. 107117928

(51) Int. Cl.
*H01L 27/146* (2006.01)
*H04N 5/355* (2011.01)
*H04N 5/353* (2011.01)
*H04N 5/378* (2011.01)

(52) U.S. Cl.
CPC .... *H01L 27/1464* (2013.01); *H01L 27/14605* (2013.01); *H01L 27/14616* (2013.01); *H01L 27/14627* (2013.01); *H01L 27/14629* (2013.01); *H01L 27/14636* (2013.01); *H04N 5/3559* (2013.01)

(58) Field of Classification Search
CPC ......... H01L 27/14689; H01L 27/14679; H01L 27/14643; H01L 27/1464
See application file for complete search history.

(56) References Cited

U.S. PATENT DOCUMENTS

2013/0146747 A1* 6/2013 Hynecek ........... H01L 27/14689
                                                                  250/208.1
2018/0213205 A1* 7/2018 Oh .................... H01L 27/14636

* cited by examiner

*Primary Examiner* — Brian Turner
(74) *Attorney, Agent, or Firm* — Hauptman Ham, LLP

(57) ABSTRACT

There is provided a structure to improve BSI global shutter efficiency. In a sensor pixel circuit, at least one strong electric field is formed at the position of a floating diffusion region to accordingly have the effect of shielding the floating diffusion region. Or, the semiconductor material from the floating diffusion node toward a light incident direction is removed in the manufacturing process such that a depletion region cannot be formed in this direction. Or, a reflection layer or a photoresist layer is formed in the light incident direction to block the light. In these ways, charges generated by the undesired noises are reduced, and noise charges are difficult to reach the floating diffusion region thereby improving the shutter efficiency.

7 Claims, 8 Drawing Sheets

PIXEL STRUCTURE TO IMPROVE BSI GLOBAL SHUTTER EFFICIENCY

RELATED APPLICATIONS

The present application claims priority to Taiwanese Application Number 107117928, filed May 25, 2018, the disclosure of which is hereby incorporated by reference herein in its entirety.

BACKGROUND

1. Field of the Disclosure

This disclosure generally relates to a structure to improve back-side illuminated global shutter efficiency and, more particularly, to forming an electric field near a floating diffusion node to absorb additional electrons or forming a structure to shield additional electrons from entering the floating diffusion node thereby improving the shutter efficiency.

2. Description of the Related Art

In the conventional back-side illuminated (BSI) global shutter image sensor, all sensor pixels of the image sensor are exposed at the same time due to its global shutter feature. The exposure data is stored temporarily and then outputted in turn. As the readout time has a difference and the sensing elements are continuously stimulated by external light during the readout interval to generate undesired noises, the exposure data being readout later is influenced more by the noises. As the noises and the exposure data are both charges, once the exposure data is polluted by the noise charges, it is not able to separate the noises from the exposure data to cause the distortion of the image signal, i.e. decreasing the shutter efficiency.

To solve this problem, the present disclosure provides the improvement on pixel structure that forms an electric field to absorb additional electrons near a floating diffusion node, or arranges a structure to shield additional electrons from entering the floating diffusion node thereby improving the shutter efficiency.

SUMMARY

The present disclosure is related to a structure to improve the back-side global shutter efficiency by arranging a high voltage terminal of a device in a sensor pixel circuit at a position very close to a floating diffusion region to form at least one strong electric field that has the effect of shielding the floating diffusion region. In this way, charges generated by undesired noises are difficult to reach the floating diffusion region, i.e. absorbed by the strong electric field, to improve the shutter efficiency.

The present disclosure is related to a structure to improve the back-side global shutter efficiency by additionally adding an n− doping region to form a guard ring with the doping region of the source follower device to form a strong electric field that has the effect of shielding a floating diffusion region. In this way, charges generated by undesired noises are difficult to reach the floating diffusion region, i.e. absorbed by the strong electric field, to improve the shutter efficiency.

The present disclosure is related to a structure to improve the back-side global shutter efficiency. In order to make charges generated by undesired noises difficult to reach a floating diffusion region, the semiconductor material from a floating diffusion node toward a light incident direction is removed in the manufacturing process such that a depletion region cannot be formed in this direction. In this way, charges generated by undesired noises do not have any path to reach the floating diffusion node thereby improving the shutter efficiency.

The present disclosure is related to a structure to improve the back-side global shutter efficiency. In order to make charges generated by undesired noises difficult to reach the floating diffusion region, the deep trench isolation structure is formed from a floating diffusion region extending toward a light incident direction in the manufacturing process such that a depletion region cannot be formed in this direction. In this way, charges generated by undesired noises do not have any path to reach the floating diffusion node thereby improving the shutter efficiency.

The present disclosure is related to a structure to improve the back-side global shutter efficiency. In order to make charges generated by undesired noises difficult to reach a floating diffusion region, a reflection layer is formed on the semiconductor material opposite to a floating diffusion node in a light incident direction in the manufacturing process such that the incident light is not able to enter the semiconductor material to generate noise charges. In this way, the charges triggered by undesired noises are reduced thereby improving the shutter efficiency.

In the present disclosure, technical characters provided by the present disclosure can be implemented together. For example, by determining the arranged position of a high voltage terminal of the device and removing the semiconductor material opposite to a floating diffusion node in a light incident direction in the manufacturing process, the depletion region cannot be formed in this direction. These two methods cause the charges generated by undesired noises to have no path reaching the floating diffusion node to accordingly improve the shutter efficiency.

The present disclosure provides a pixel structure including a base layer, a floating diffusion node and two source follower devices. The floating diffusion node is arranged inside the base layer. The two source follower devices are arranged at two opposite sides of the floating diffusion node. Each source follower device includes an n+ doping region in the base layer, and said n+ doping region are configured to form an electric field in the base layer surrounding the floating diffusion node to shield the floating diffusion node.

The present disclosure further provides a pixel structure including a base layer and a floating diffusion node. The floating diffusion node is arranged inside the base layer, wherein a hollow region is arranged inside the base layer and right above the floating diffusion node such that a depletion region is not formed above the floating diffusion node.

The present disclosure further provides a pixel structure including a base layer and a floating diffusion node. The floating diffusion node is arranged inside the base layer, wherein a deep trench isolation region is formed inside the base layer surrounding an area above the floating diffusion node to cause charge carriers outside the deep trench isolation region to not enter the floating diffusion node.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts.

One objective of the present disclosure is to use the improvement of a pixel structure to improve the shutter efficiency by forming an electric field to attract additional electrons close to a floating diffusion node or arranging a structure to shield the additional electrons from entering the floating diffusion node. In the global shutter image sensor, as charges generated in the exposure interval and not being readout are temporarily stored in the floating diffusion node, accurate exposure data cannot be retrieved once these stored charges are influenced by noises. Accordingly, it is the most important issue to prevent these stored charges from being polluted by noises. The separate embodiments in the present disclosure below may be combined together to achieve superimposed functions.

Figure 1A:
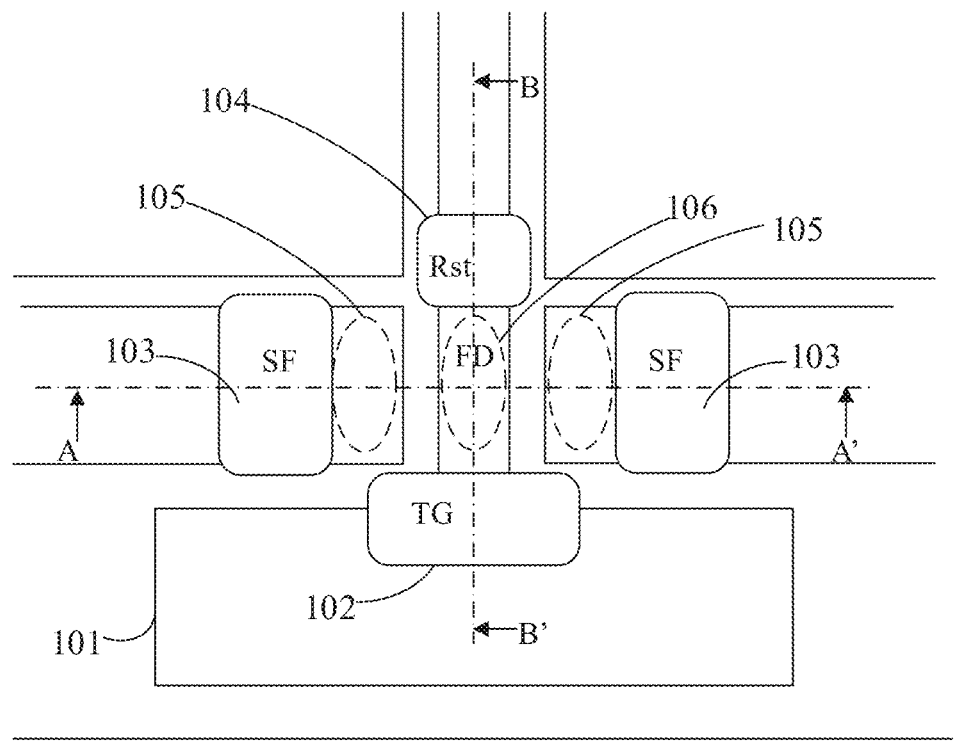
FIG. 1A is a top view of a pixel structure according to one embodiment of the present disclosure.

Referring to FIG. 1A, it is a top diagram of a pixel structure according to one embodiment of the present disclosure. This embodiment uses a transistor which is served as a source follower device 103, and said transistor has a high voltage terminal 105. The pixel structure of a sensor pixel circuit of this embodiment includes a photodiode 101, a transfer control gate (TG) 102, a reset transistor (Rst) 104 and a floating diffusion node (FD) 106, wherein the transfer control gate 102 and the reset transistor 104 are arranged at two opposite sides along a first direction (e.g., up and down direction in FIG. 1A) of the floating diffusion node 106. Two source follower devices 103 are arranged at positions very close to (e.g., smaller than 0.3 micrometer in the 90-nm process) the floating diffusion node 106, e.g., FIG. 1A showing the two source follower devices 103 being arranged at two opposite sides of the floating diffusion node 106 along a second direction (e.g., left and right direction in FIG. 1A). The second direction is, for example, perpendicular to the first direction. In the present disclosure, the two source follower devices 103 are connected to a same readout line to output exposure data stored in the floating diffusion node 106.

When the sensor pixel circuit is in operation, a high voltage terminal 105 is applied with a high voltage. In this way, a strong electric field is formed surrounding a region of the floating diffusion node 106 (as shown in FIG. 1A). Accordingly, when charges generated by the undesired noises approach the region of the floating diffusion node 106, said charges are absorbed by the strong electric field and unable to reach the region of the floating diffusion node 106. Accordingly, the shutter efficiency is improved.

Figure 1B:
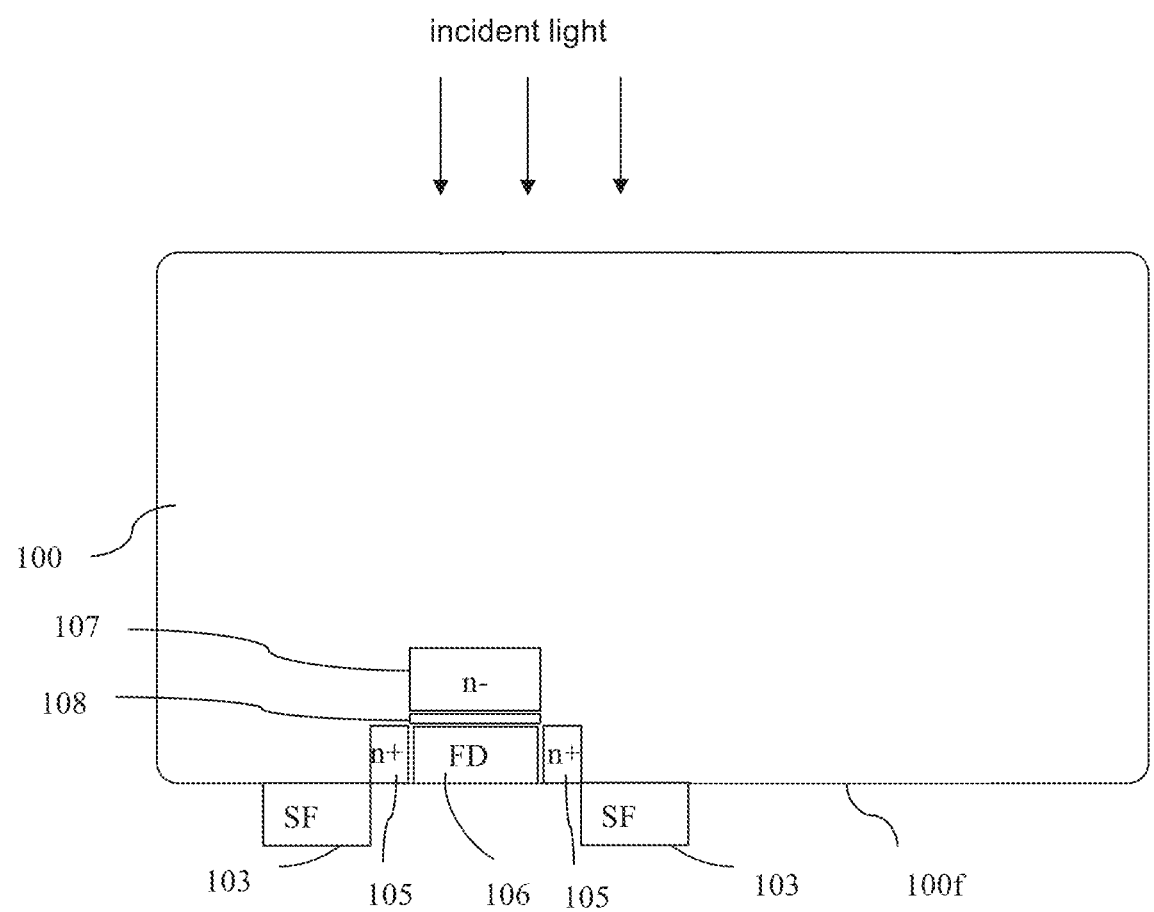
FIG. 1B is a cross sectional view of FIG. 1A along line A-A'.

FIG. 1B is a cross sectional view of the pixel structure in FIG. 1A along A-A' line. The pixel structure includes a base layer 100, a floating diffusion node 106 and two source follower devices 103. The base layer 100 is made of the semiconductor material generally used in the based layer of, for example, a CMOS image sensor. The floating diffusion node 106 is arranged in the base layer 100 and close to a front surface 100f thereof. The two source follower devices 103 are arranged at two opposite sides of the floating diffusion node 106, and each floating diffusion node 106 has an n+ doping region (i.e. the above mentioned high voltage terminal) inside the base layer 100. The n+ doping region is used to form an electric field inside the base layer 100 surrounding the floating diffusion node 106 when the pixel structure is in operation to prevent charge carriers of noises from entering the floating diffusion node 106.

In other aspects, a guard ring is formed near the floating diffusion node 106. In this aspect, the base layer 100 is further formed with an n− doping region right above the floating diffusion node 106. When the n+ doping regions of the two source follower devices 103 are applied with a voltage, a strong electric field is formed embracing the a region of the floating diffusion node 106. Further, the n+ doping regions 105 join the n− doping region due to the punch through such that the guard ring is formed surrounding the floating diffusion node 106 to shield the floating diffusion node 106 from receiving noise charges. In this way, when charges triggered by undesired noises approach the region of the floating diffusion node 106, said charges are absorbed by the strong electric field formed by the guard ring and unable to reach the region of the floating diffusion node 106. Accordingly, the shutter efficiency is improved.

Figure 2:
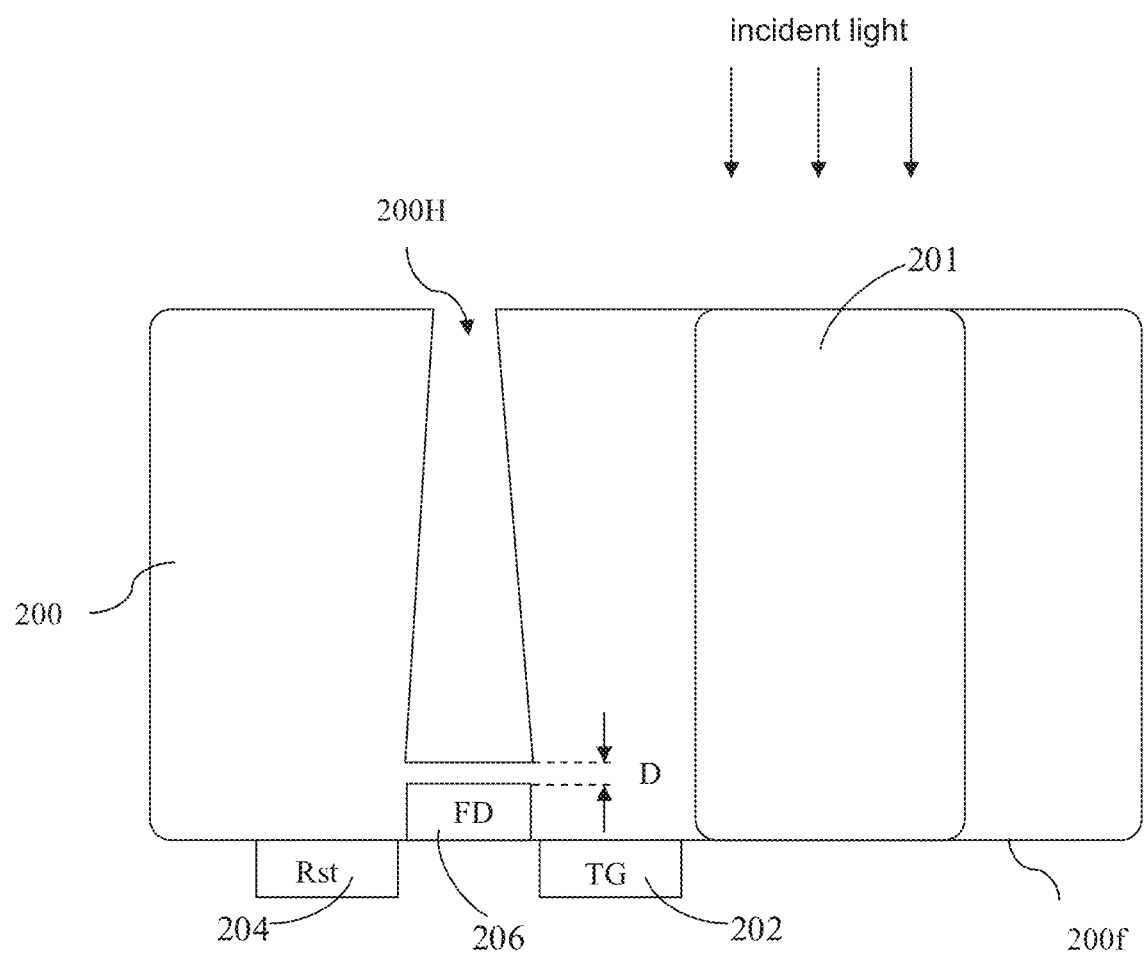
FIG. 2 is a schematic diagram of a pixel structure according to another embodiment of the present disclosure, showing a cross sectional view of a pixel structure similar to FIG. 1A along line B-B'.

Referring to FIG. 2, it is another embodiment of the present disclosure which shows a cross sectional view of a pixel structure similar to FIG. 1A along line B-B'. FIG. 2 shows only the elements in the pixel structure of a sensor pixel circuit related to the present disclosure including a photodiode 201, a transfer control gate (TG) 202, a reset transistor (Rst) 204 and a floating diffusion node (FD) 206, wherein the floating diffusion node 206 is arranged in the base layer 200 at a side close to a front surface 200f thereof. In this embodiment, in order to prevent charges generated by the undesired noises from reaching a region of the floating diffusion node 206, the semiconductor material opposite to the floating diffusion node 206 is etched, in the manufacturing process, along a light incident direction to form a hollow region such that a depletion region is not formed in this direction. That is, the base layer 200 has a hollow region 200H therein right above the floating diffusion node 206 such that a depletion region is not formed above the floating diffusion node 206 in operation. As the main function of the region of floating diffusion node 206 is to temporarily store charges from the photodiode 201 in their original state to be read later by the readout circuit, a thin subtract is enough for forming the floating diffusion node 206 to have the storage function. Accordingly, the circuit function of the floating diffusion node 206 is not degraded even though the semiconductor material above the floating diffusion node 206 is removed along the light incident direction to very thin. For example, a bottom surface of the hollow region 200H is separated from a top surface of the floating diffusion node 206 by a distance D of 0.5 µm to 1 µm, and a bottom area of the hollow region 200H is larger than or equal to a cross sectional area of the floating diffusion node 206. Based on this structure, charges generated by the undesired noises do not have any path to reach the floating diffusion node 206 to improve the shutter efficiency. Furthermore, the opening is filled by other materials to enhance the strength stability of the semiconductor structure. For example, an inner surface of the hollow region 200H is covered by a dielectric layer at first and the hollow region 200H is then filled with an isolation layer above the dielectric layer.

Figure 3:
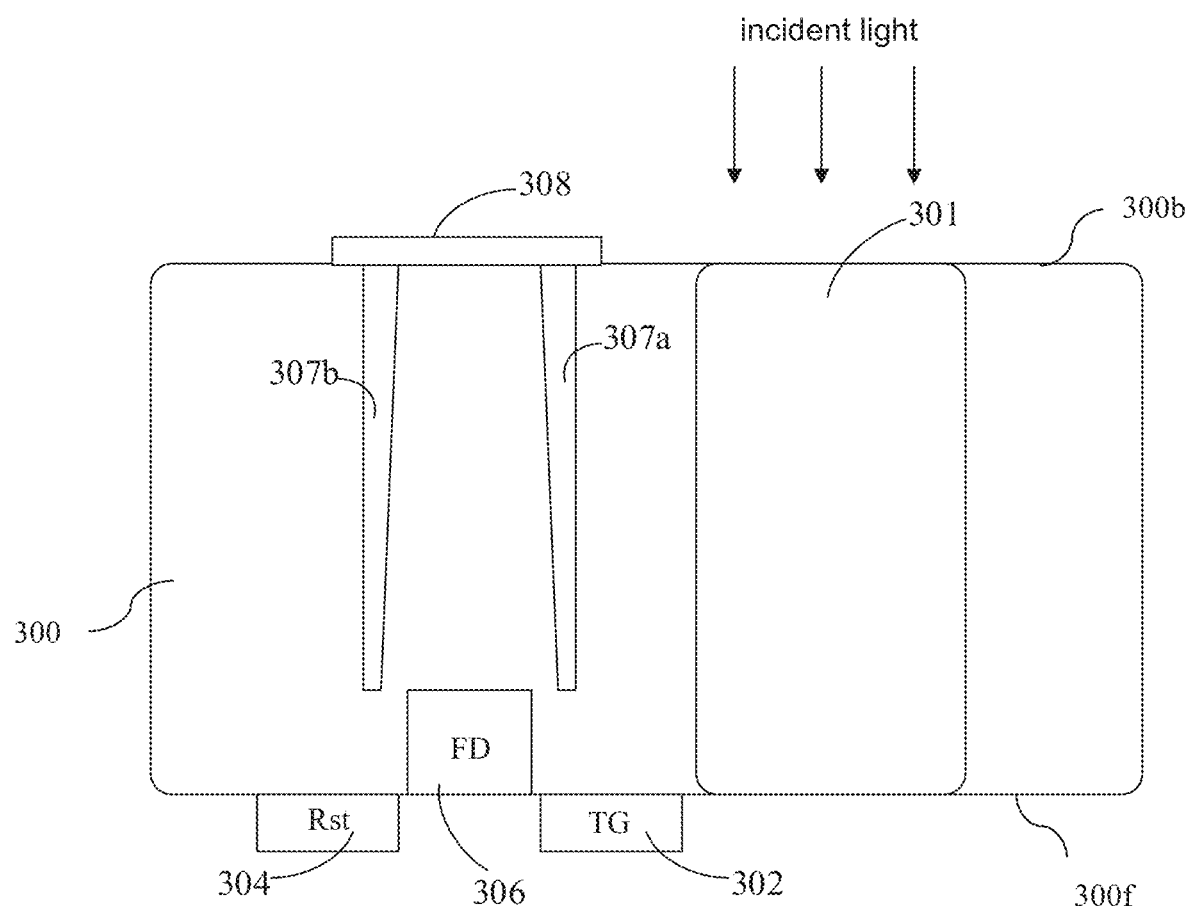
FIG. 3 is a schematic diagram of a pixel structure according to an alternative embodiment of the present disclosure, showing a cross sectional view of a pixel structure similar to FIG. 1A along line B-B'.

Referring to FIG. 3, it is another embodiment of the present disclosure which shows a cross sectional view of a pixel structure similar to FIG. 1A along line B-B'. FIG. 3 shows only the elements in the pixel structure of a sensor pixel circuit related to the present disclosure including a photodiode 301, a transfer control gate (TG) 302, a reset transistor (Rst) 304, a floating diffusion node (FD) 306, deep trench isolation (DTI) regions 307a and 307b, and a reflection layer 308 (optional), wherein the floating diffusion node 306 is arranged at a side of the base layer 300 close to the front surface 300f. In this embodiment, in order to prevent charges generated by the undesired noises from reaching a region of the floating diffusion node 306, DTI regions 307a and 307b are formed in the manufacturing process and preferably having a depth close to a region of the floating diffusion node 306, e.g., extending from the hack surface 300b to the front surface 300f of the base layer 300 to the depth of a top surface of the floating diffusion node 306 but not right above the floating diffusion node 306. In this way, charges generated by the noises are blocked from entering the region of the floating diffusion node 306. In this embodiment, the DTI regions 307a and 307b are arranged to surround an area above the floating diffusion node 306 such that charge carriers outside the DTI regions 307a and 307b do not enter the floating diffusion node 306. It should be mentioned that although FIG. 3 shows two DTI regions 307a and 307b, it is because FIG. 3 is a cross sectional view. The DTI region is preferably formed as a tube or pipe shape extending from the back surface 300b to the front surface 300f.

In addition, a reflection layer 308 is further formed on the semiconductor substrate (e.g., back surface 300b of the base layer 300) above a region of the floating diffusion node 306, e.g., right above the floating diffusion node 306, to further reduce the incident light to enter the substrate and generate noise charges. As the photodiode 301 is not blocked by the reflection layer 308, the sensing ability is not degraded. The reflection layer 308 is formed by metal material, such as copper or aluminum, but not limited to. Similarly, an inner surface of the DTI region is firstly covered by a dielectric layer and then the DTI region is filled with an isolation layer above the dielectric layer to enhance the structure strength.

Figure 4:
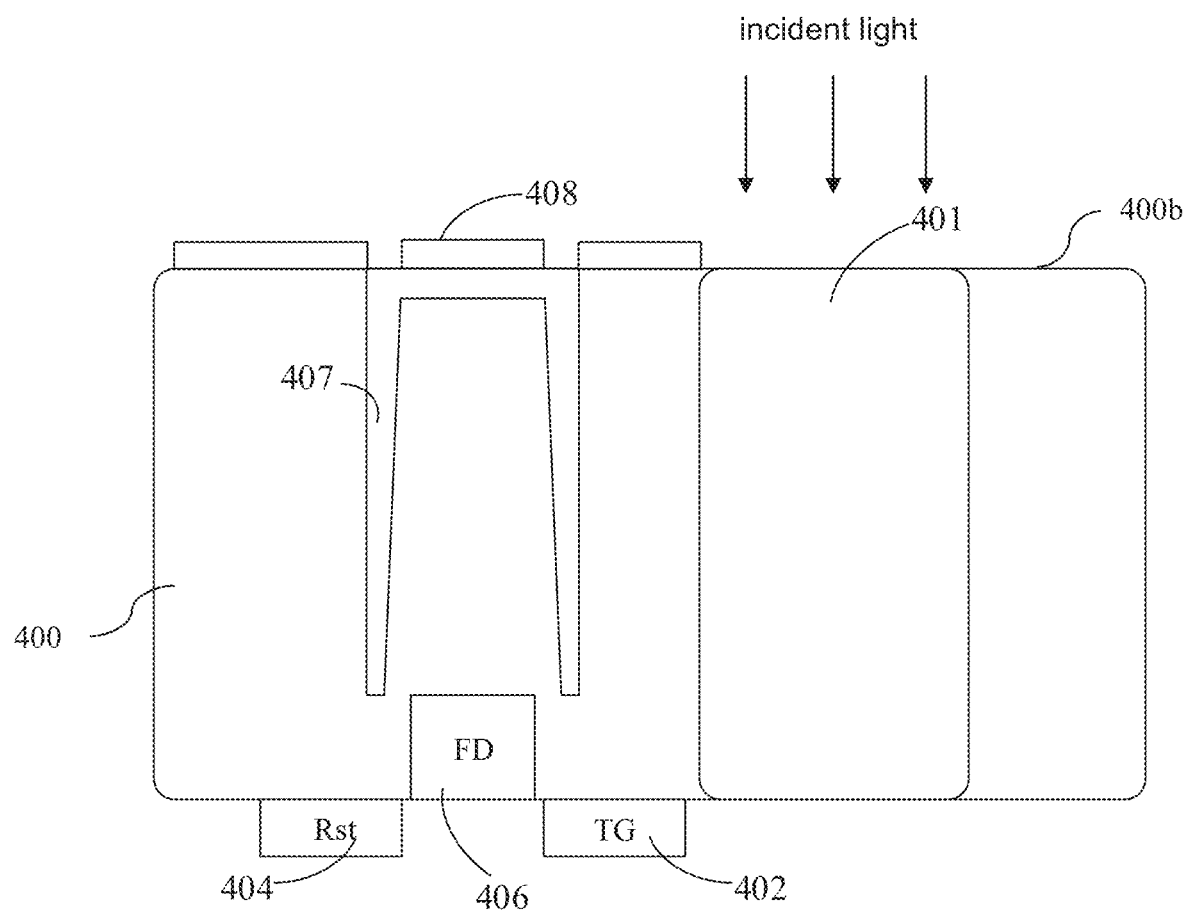
FIG. 4 is a schematic diagram of a pixel structure according to an alternative embodiment of the present disclosure, showing a cross sectional view of a pixel structure similar to FIG. 1A along line B-B'.

Referring to FIG. 4, it is another embodiment of the present disclosure which shows a cross sectional view of a pixel structure similar to FIG. 1A along line B-B'. FIG. 4 shows only the elements in the pixel structure of a sensor pixel circuit related to the present disclosure including a photodiode 401, a transfer control gate (TG) 402, a reset transistor (Rst) 404, a floating diffusion node 406, a DTI region 407 and a photoresist layer 408. In this embodiment, in order to prevent charges generated by the undesired noises from reaching a region of the floating diffusion node 406, a DTI region 407 is formed in the manufacturing process. The difference from the DTI regions 307a and 307b in FIG. 3 is that in this embodiment a transverse hollow region is further formed, e.g., by etching, at the back surface 400b of the base layer 400 right above the floating diffusion node 406. The transverse hollow region connects the DTI region (e.g., the DTI regions 307a and 307b in FIG. 3) extending vertically downward such that the DTI region 407 is form as an arch shape or a cup shape covering a region of the floating diffusion node 406 to fully block charges generated by the noises. In this embodiment, the photoresist layer 408 is further left (e.g., after etching process) on the semiconductor substrate above the floating diffusion node 406 (e.g., on the back surface 400b of the base layer 400) and surrounding the DTI region 407 to have a similar function as the reflection layer 308 in the previous embodiment that further reduces incident light to enter the substrate and generating noise charges.

It should be noted that the DTI region is selectively to form in the base layer 200 as many as possible outside the region of photodiode 401. With the DTI region in the base layer 400, noise charges is reduced. Similarly, the DTI region 407 is filled with other material to enhance the structure strength.

Figure 5A:
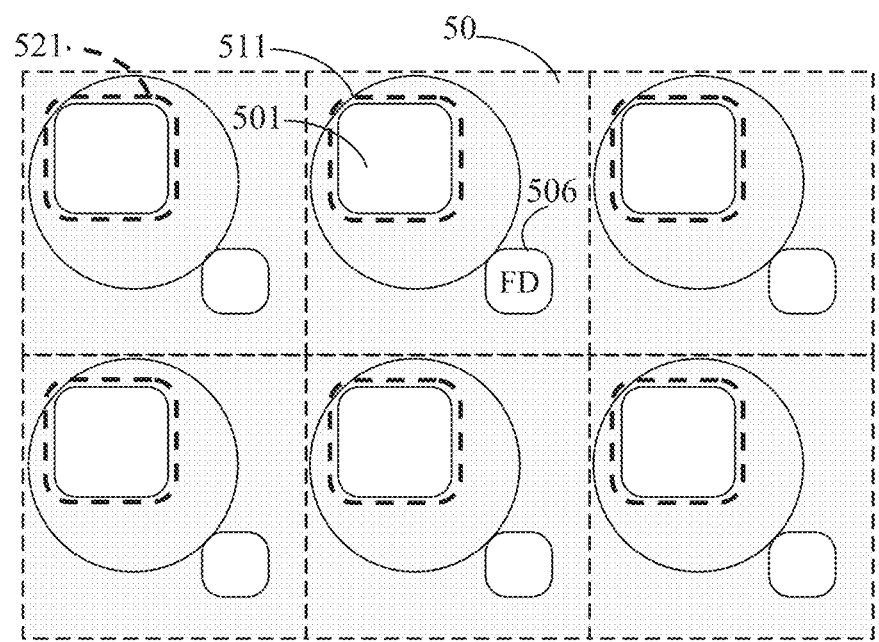
FIG. 5A is a schematic diagram of a pixel array according to one embodiment of the present disclosure.

FIG. 5A shows a pixel array according to one embodiment of the present disclosure, in which a plurality of microlenses 511 are formed on a light receiving surface of the sensor pixel circuit to change the light distribution such that the light entering a region of the floating diffusion node 506 is reduced. For example, convex lenses are arranged upon the photodiode region 501, and as the convex lenses has the ability of converging light, more lights is converged into the photodiode region 501 while entering the sensor pixel. On the contrary, the light entering the region of the floating diffusion node 506 and triggering noise charges is reduced.

The embodiment of FIG. 5A is implemented in combination with the above FIGS. 1A-1B, 2, 3 and 4. As shown in FIG. 5A, each pixel structure of the pixel array 50 of this embodiment includes a photodiode 501 located in the base layer 100 to 400 and arranged at a transverse direction (FIG. 5A showing a left-upper direction, but not limited to) of the floating diffusion node 506. The microlenses 511 are arranged on a back surface of the base layers 100 to 400 opposite to the photodiode 501 and overlapping or not overlapping with the floating diffusion node 506 therebelow.

Figure 5B:
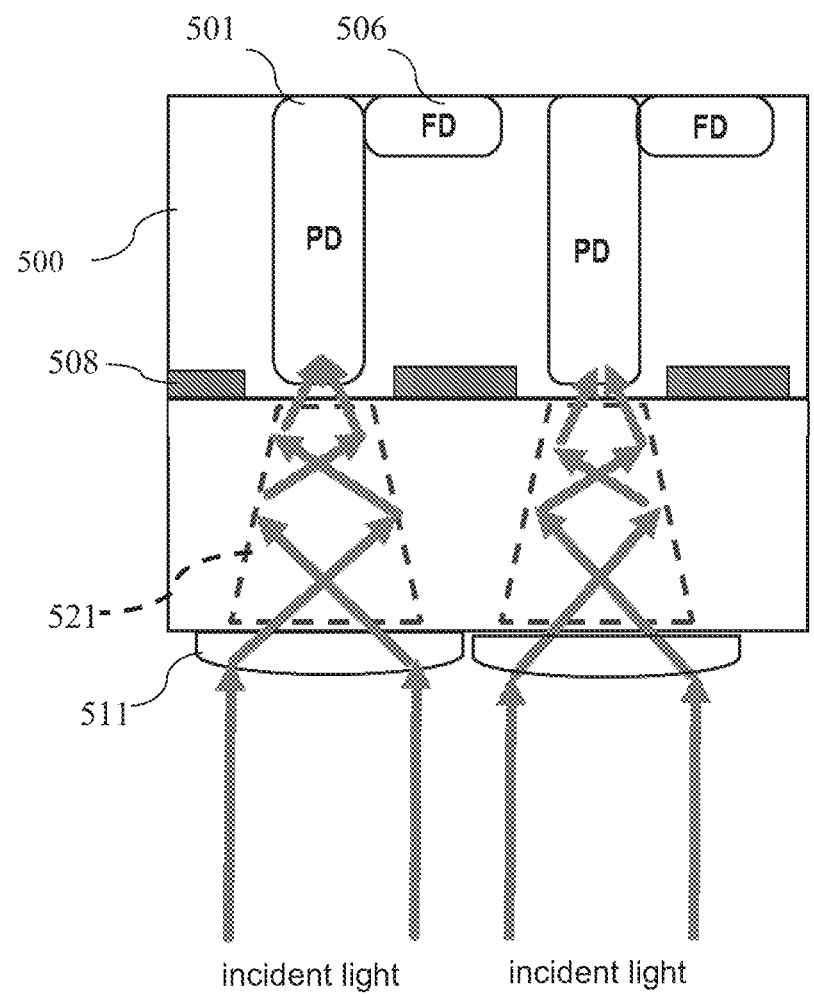
FIG. 5B is a cross sectional view of FIG. 5A.

Referring to FIG. 5B, it is a cross sectional view of the pixel circuit of FIG. 5A. To further converge the incident light to the photodiode 501 and reduce the incident light to enter other regions of the semiconductor material to generate noise charges, the pixel structure of this embodiment further includes a light guide 521 arranged between the microlens 511 and the photodiode 501. In addition, an opaque layer or reflection layer 508 (e.g., using copper or aluminum) is further formed upon the floating diffusion node 506 to reduce the incident light to enter the semiconductor material above the floating diffusion node 506.

Figure 6:
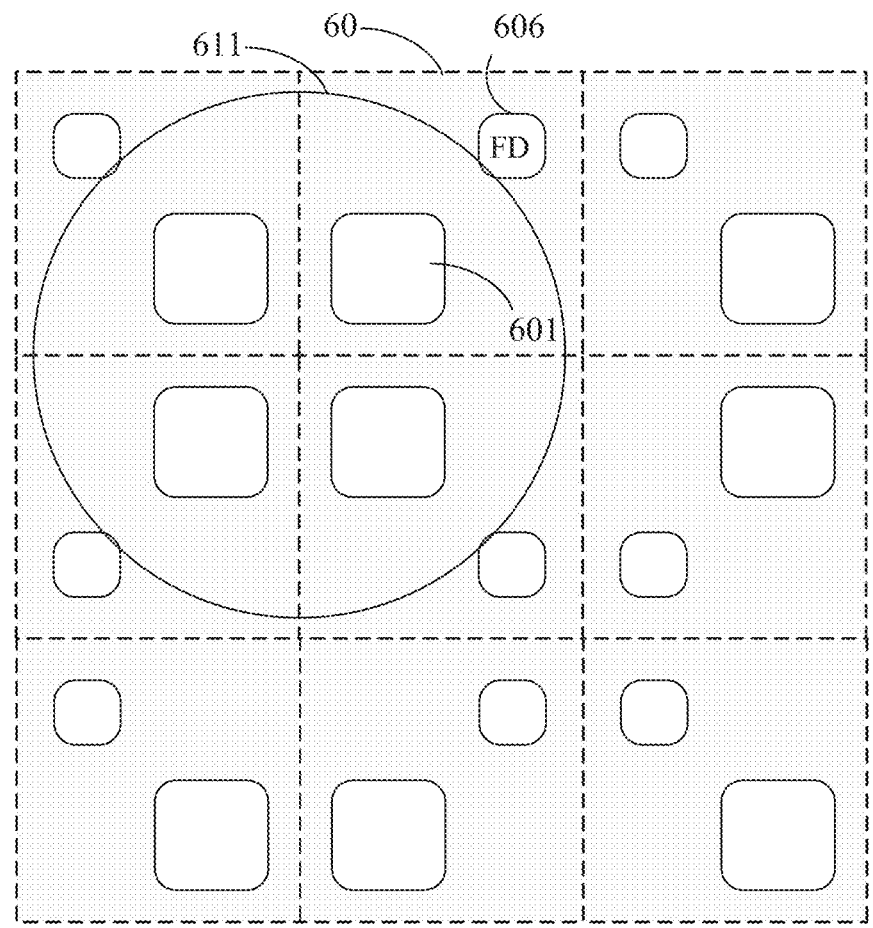
FIG. 6 is a schematic diagram of a pixel array according to another embodiment of the present disclosure.

FIG. 6 shows a pixel array according to another embodiment of the present disclosure in which the sensor pixel circuit of adjacent pixels in the pixel array 60 is arranged to cause the photodiode regions 601 of the sensor pixel circuit to close to each other and share a larger microlens 611, which converges the incident light to multiple photodiode regions 601. The region surrounding the floating diffusion node 606 has less incident light to trigger noise charges. Compared with FIG. 5, this embodiment has the benefit of reducing a number of lenses and easier manufacturing process such that the manufacturing yield is improved.

In FIG. 6, the microlens 611 is arranged upon the floating diffusion node 606 to not overlap or overlap a part of the floating diffusion node 606 therebelow. Similarly, an optics such as a light guide is further formed between the microlens 611 and the photodiode 601 (referring to FIG. 5B) to improve the sensing efficiency and reduce the noise charges.

As mentioned above, technique characters provided by the present disclosure can be implemented together. For example, by determining the arranged position of a high voltage terminal of the source follower device and removing the semiconductor material opposite to a floating diffusion node in a light incident direction in the manufacturing process, the depletion region cannot be formed in this direction. These two methods cause the charges generated by undesired noises to have no path to reach the floating diffusion node such that the shutter efficiency is improved.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. A pixel structure, comprising:
    a base layer;
    a floating diffusion node arranged inside the base layer; and
    two source follower devices arranged at two opposite sides of the floating diffusion node, each source follower device comprises an n+ doping region in the base layer, said n+ doping region configured to form an electric field in the base layer surrounding the floating diffusion node to shield the floating diffusion node.

2. The pixel structure as claimed in claim 1, further comprising a transfer control gate and a reset transistor arranged at two opposite sides of the floating diffusion node along a first direction, wherein the two source follower devices are arranged at two opposite sides of the floating diffusion along a second direction.

3. The pixel structure as claimed in claim 1, wherein the base layer further comprises an n− doping region right above the floating diffusion node.

4. The pixel structure as claimed in claim 3, wherein when the n+ doping region of the two source follower devices are applied with a voltage, the n+ doping region and the n− doping region joint together due to punch through to form a guard ring in the base layer surrounding the floating diffusion node to shield the floating diffusion node.

5. The pixel structure as claimed in claim 1, wherein the two source follower devices are connected to a same readout line.

6. The pixel structure as claimed in claim 1, further comprising:
    a photodiode arranged inside the base layer and located at a transverse direction from the floating diffusion node; and
    a microlens arranged on a back surface of the base layer and opposite to the photodiode.

7. The pixel structure as claimed in claim 6, further comprising a light guide arranged between the microlens and the photodiode.

* * * * *